(12) United States Patent
Yoshida et al.

(10) Patent No.: US 11,551,953 B2
(45) Date of Patent: Jan. 10, 2023

(54) SUBSTRATE TRANSFER APPARATUS AND METHOD FOR CALCULATING POSITIONAL RELATIONSHIP BETWEEN SUBSTRATE TRANSFER ROBOT AND SUBSTRATE PLACEMENT PORTION

(71) Applicant: KAWASAKI JUKOGYO KABUSHIKI KAISHA, Kobe (JP)

(72) Inventors: Masaya Yoshida, Himeji (JP); Kenji Noguchi, Kobe (JP); Hiroyuki Okada, Kakogawa (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 366 days.

(21) Appl. No.: 16/652,147

(22) PCT Filed: Jul. 30, 2018

(86) PCT No.: PCT/JP2018/028493
§ 371 (c)(1),
(2) Date: Mar. 30, 2020

(87) PCT Pub. No.: WO2019/064891
PCT Pub. Date: Apr. 4, 2019

(65) Prior Publication Data
US 2020/0251363 A1   Aug. 6, 2020

(30) Foreign Application Priority Data
Sep. 29, 2017   (JP) .............................. JP2017-191619

(51) Int. Cl.
*H01L 21/67* (2006.01)
*B25J 9/00* (2006.01)
(Continued)

(52) U.S. Cl.
CPC ...... *H01L 21/67259* (2013.01); *B25J 9/0096* (2013.01); *B25J 9/104* (2013.01);
(Continued)

(58) Field of Classification Search
CPC . H01L 21/67259; H01L 21/68; H01L 21/681; H01L 21/682;
(Continued)

(56) References Cited

U.S. PATENT DOCUMENTS 6,044,308 A * 3/2000 Huissoon ............... B25J 9/1692
  700/254
6,321,137 B1 * 11/2001 De Smet ................ B25J 9/1692
  700/263
(Continued)

FOREIGN PATENT DOCUMENTS

JP   06072513 A  *  3/1994  ....... H01L 21/67265
JP   2005-310858 A   11/2005

*Primary Examiner* — Gerald McClain
(74) *Attorney, Agent, or Firm* — Oliff PLC

(57) ABSTRACT

The method includes the steps of: detecting a part, of a surface of a target, that is located on an inner circumferential side of a predetermined circle centered on a rotation axis and passing the target, by an object detection sensor, at plural rotation positions when at least one of a rotation position of the target about the rotation axis on a substrate placement portion and a rotation position of a detection area about a robot reference axis is changed; calculating a quantity correlated with an index length representing a distance from the robot reference axis to the target when the target is detected by the object detection sensor, for each rotation position; and calculating the positional relationship between the robot reference axis and the rotation axis on the basis of, among the rotation positions, the one at which the quantity correlated with the index length is maximized or minimized.

3 Claims, 8 Drawing Sheets

(51) Int. Cl.
    *B25J 19/02* (2006.01)
    *B65G 47/80* (2006.01)
    *H01L 21/687* (2006.01)
    *B25J 11/00* (2006.01)
    *B25J 9/16* (2006.01)
    *B25J 9/10* (2006.01)

(52) U.S. Cl.
    CPC ......... *B25J 9/1694* (2013.01); *B25J 11/0095* (2013.01); *B25J 19/02* (2013.01); *B65G 47/80* (2013.01); *H01L 21/68707* (2013.01); *B65G 2201/0297* (2013.01); *G05B 2219/31081* (2013.01); *G05B 2219/45031* (2013.01); *G05B 2219/50391* (2013.01)

(58) Field of Classification Search
    CPC ....... H01L 21/68714–68757; H01L 21/68785; H01L 21/68792; B25J 9/0096; B25J 9/104; B25J 9/1694; B25J 11/0095; G05B 2219/31081; G05B 2219/45031; G05B 2219/50391
    See application file for complete search history.

(56) References Cited

U.S. PATENT DOCUMENTS

| | | | |
|---|---|---|---|
| 6,408,252 B1* | 6/2002 | De Smet | B25J 9/1692 700/254 |
| 6,529,852 B2* | 3/2003 | Knoll | B25J 9/1692 702/150 |
| 10,974,388 B2* | 4/2021 | Yoshida | B25J 9/1612 |
| 2007/0065144 A1* | 3/2007 | Hofmeister | H01L 21/67259 355/72 |
| 2009/0157226 A1* | 6/2009 | de Smet | G01B 11/002 901/50 |
| 2014/0107825 A1* | 4/2014 | Kubodera | H01L 21/67259 700/112 |
| 2016/0318182 A1* | 11/2016 | Nakaya | B25J 9/1697 |

* cited by examiner

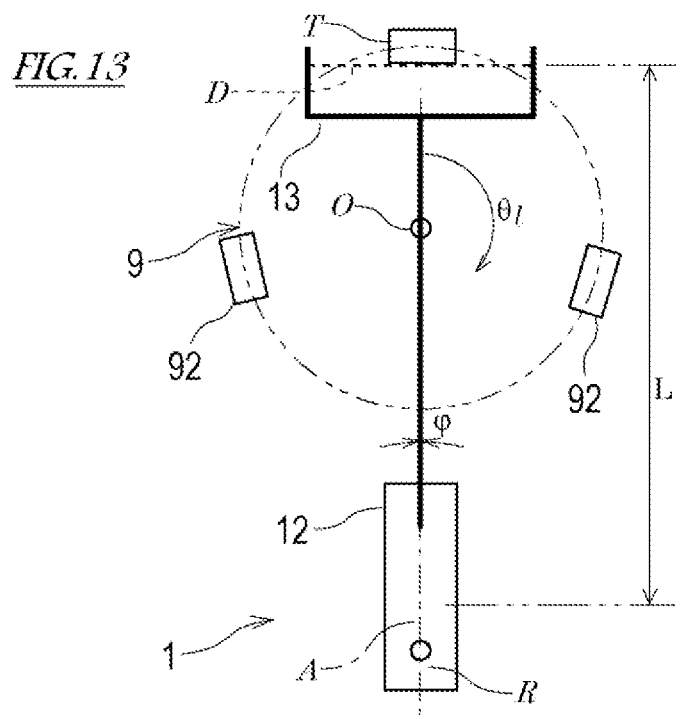

SUBSTRATE TRANSFER APPARATUS AND METHOD FOR CALCULATING POSITIONAL RELATIONSHIP BETWEEN SUBSTRATE TRANSFER ROBOT AND SUBSTRATE PLACEMENT PORTION

TECHNICAL FIELD

The present invention relates to a substrate transfer apparatus including a substrate transfer robot and a substrate placement portion.

BACKGROUND ART

Conventionally, in a semiconductor process, a substrate placement portion on which a plurality of semiconductor substrates can be placed in an aligned state is used for performing processing for the plurality of semiconductor substrates collectively. In general, such a substrate placement portion includes a pair of plate members separated from each other and a plurality of support columns extended between the pair of plate members. Each support column has a plurality of support grooves provided at a constant pitch in the axial direction of the support column. A peripheral portion of a substrate is fitted into the support grooves, whereby the substrate is supported by the support columns.

A substrate transfer robot is used for transferring a substrate onto/from the above-described substrate placement portion. In general, the substrate transfer robot includes a robot arm, a substrate transfer hand mounted to an end of the robot arm, and a controller. The substrate transfer hand has a substrate holding portion for holding a substrate, and the substrate can be held by being sucked or grasped, for example. PTL 1 exemplifies a substrate transfer hand which has a plate-shaped blade with an end forked in a Y shape and transfers the substrate placed on the blade.

In the substrate transfer robot described in PTL 1, a light emitting portion is attached to one of both Y-shape-forked ends of the substrate transfer hand, and a light receiving portion is attached to the other end so as to be opposed to the light emitting portion. The light emitting portion and the light receiving portion form a transmission-type photo-sensor, and the transmission-type photo-sensor can detect an object obstructing the optical axis. An external teaching jig attached to a front outer wall of a substrate processing device is detected by the transmission-type photo-sensor, whereby, using the relative positional relationship between the center of the known taught position inside the substrate processing device and the center of an external taught position, the relative positional relationship between the substrate transfer apparatus and the center of the taught position is estimated.

CITATION LIST

Patent Literature

PTL 1: Japanese Laid-Open Patent Publication No. 2005-310858

SUMMARY OF INVENTION

Technical Problem

Some substrate placement portions are configured to be placed and fixed on a turntable and rotate integrally with the turntable. On such a substrate placement portion, a substrate is placed such that the rotation axis of the substrate placement portion and the center of the substrate coincide with each other. Therefore, an operator operates a teaching pendant while visually confirming the substrate transfer robot and the substrate placement portion, thereby teaching the substrate transfer robot the substrate placement position so that the rotation axis of the substrate placement portion and the center of the substrate coincide with each other. However, such a teaching operation is an extremely complicated operation, and thus technology for automatically and precisely teaching the substrate transfer robot the placement position on the substrate placement portion is desired.

Since a substrate has a predetermined round shape, it is possible to easily derive the substrate placement position on the substrate placement portion on the basis of the position of the rotation axis of the substrate placement portion. Accordingly, an object of the present invention is to provide technology for calculating the positional relationship between a robot reference axis of a substrate transfer robot and a rotation axis corresponding to the center of rotation of a substrate placement portion by using the substrate transfer robot.

Solution to Problem

A method for calculating a positional relationship between a substrate transfer robot and a substrate placement portion according to one aspect of the present invention is a method for calculating a positional relationship between a substrate transfer robot and a substrate placement portion, the substrate transfer robot being provided with a robot reference axis and having an object detection sensor for detecting an object obstructing a detection area, and a robot arm for moving the detection area in a plane perpendicular to an axial direction of the robot reference axis, the substrate placement portion having a target and being configured to rotate about a rotation axis extending in parallel to the axial direction, the method including the steps of: detecting a part, of a surface of the target, that is located on an inner circumferential side of a predetermined circle centered on the rotation axis and passing the target, by the object detection sensor, at a plurality of rotation positions when at least one of a rotation position of the target about the rotation axis and a rotation position of the detection area about the robot reference axis is changed; calculating a quantity correlated with an index length representing a distance from the robot reference axis to the target when the target is detected by the object detection sensor, for each of the plurality of rotation positions; and calculating the positional relationship between the robot reference axis and the rotation axis on the basis of, among the plurality of rotation positions, the one at which the quantity correlated with the index length is maximized or minimized.

A substrate transfer apparatus according to one aspect of the present invention includes: a substrate transfer robot provided with a robot reference axis and having an object detection sensor for detecting an object obstructing a detection area, and a robot arm for moving the object detection sensor in a plane perpendicular to an axial direction of the robot reference axis; a substrate placement portion having a target to be detected by the object detection sensor, the substrate placement portion being configured to rotate about a rotation axis extending in parallel to the axial direction; and a controller configured to control operations of the substrate transfer robot and the substrate placement portion. The controller includes: a target searching unit configured to operate the substrate transfer robot and the substrate placement portion so as to detect a part, of a surface of the target, that is located on an inner circumferential side of a predetermined circle centered on the rotation axis and passing the target, by the object detection sensor, at a plurality of rotation positions when at least one of a rotation position of the target about the rotation axis and a rotation position of the detection area about the robot reference axis is changed; an index calculation unit configured to calculate a quantity correlated with an index length representing a distance from the robot reference axis to the target when the target is detected by the object detection sensor, for each of the plurality of rotation positions; and a positional relationship calculation unit configured to calculate a positional relationship between the robot reference axis and the rotation axis on the basis of, among the plurality of rotation positions, the one at which the quantity correlated with the index length is maximized or minimized.

According to the substrate transfer apparatus and the method for calculating the positional relationship between the substrate transfer robot and the substrate placement portion described above, the positive/negative sign of the amount of movement due to revolution of the target, in the direction parallel to the line connecting the robot reference axis and the detection area, and the positive/negative sign of the amount of movement due to turning of the target, in the direction parallel to the line connecting the robot reference axis and the detection area, are the same, irrespective of the shape of the target. Thus, it becomes possible to use factors that are the minimum value and the maximum value of the index length, for specifying the rotation position of the substrate placement portion, irrespective of the shape of the target.

Advantageous Effects of Invention

The present invention makes it possible to calculate the positional relationship between the robot reference axis of the substrate transfer robot and the rotation axis corresponding to the center of rotation of the substrate placement portion by using the substrate transfer robot.

BRIEF DESCRIPTION OF DRAWINGS

FIG. 13 illustrates the method for calculating the positional relationship between the substrate transfer robot and the substrate placement portion, and shows a state in which the target, the rotation axis, and the robot reference axis are arranged on the same straight line at a rotation postition $\theta 1$ of the target.

DESCRIPTION OF EMBODIMENTS

[Schematic Structure of Substrate Transfer Apparatus 10]

Figure 1:
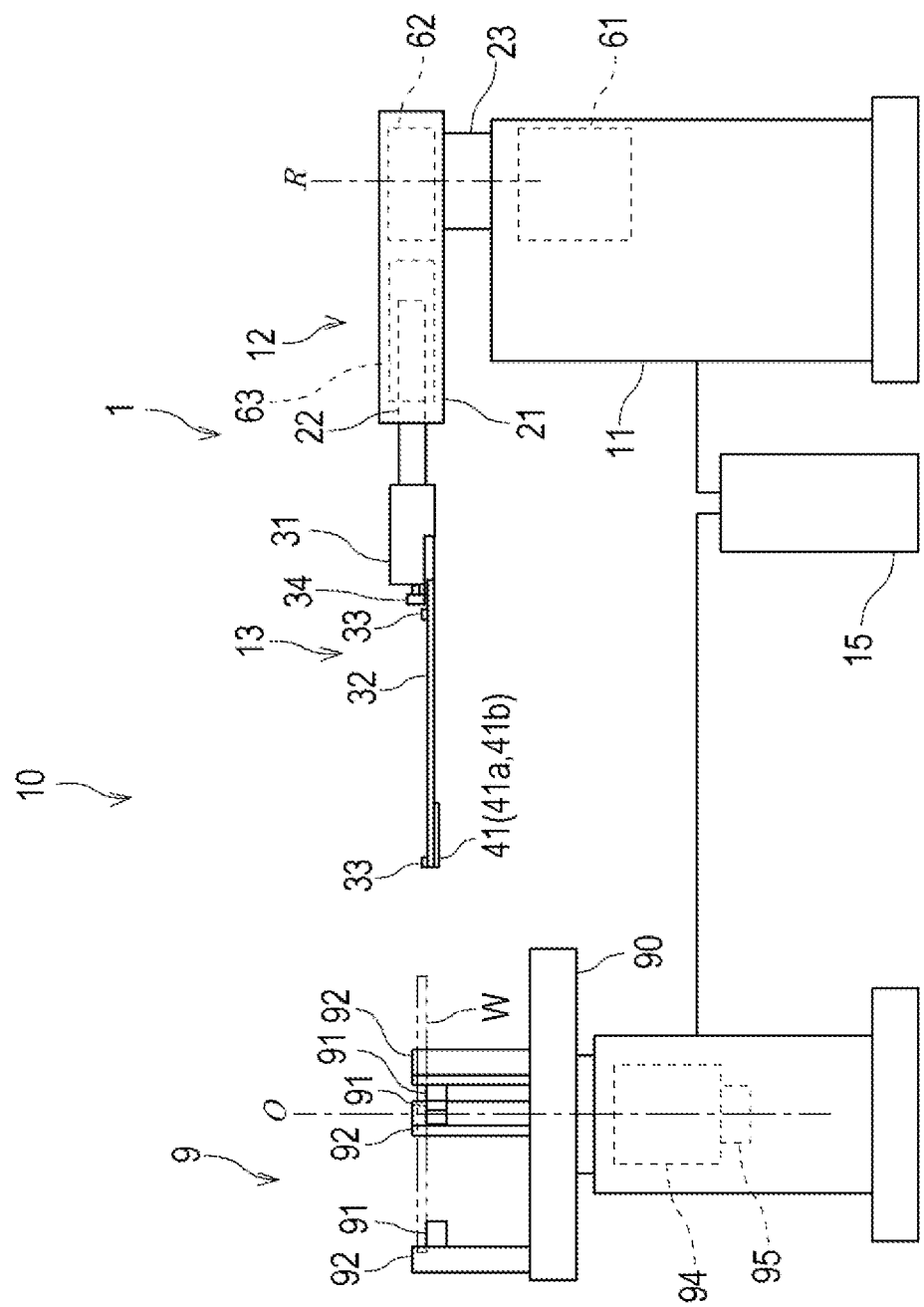
FIG. 1 is a schematic side view of a substrate transfer apparatus according to an embodiment of the present invention.
Figure 2:
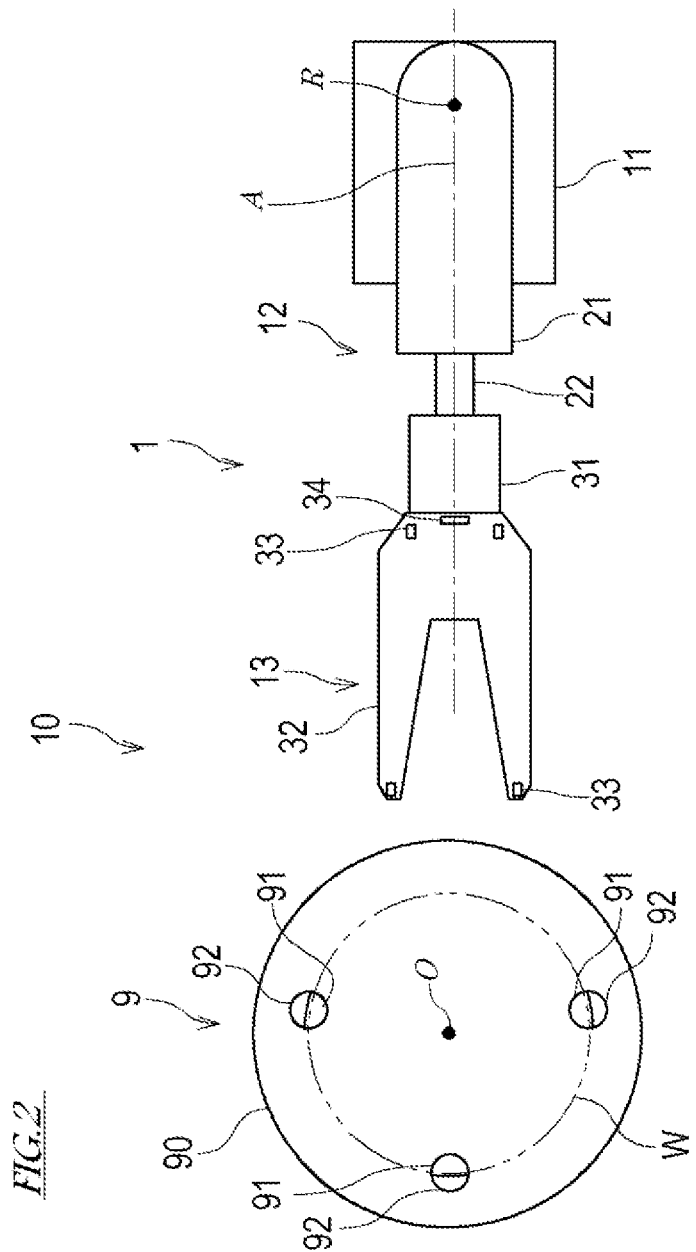
FIG. 2 is a schematic plan view of the substrate transfer apparatus.

Hereinafter, embodiments of the present invention will be described with reference to the drawings. FIG. 1 is a schematic side view of a substrate transfer apparatus 10 according to an embodiment of the present invention, and FIG. 2 is a schematic plan view of the substrate transfer apparatus 10. The substrate transfer apparatus 10 shown in FIG. 1 and FIG. 2 includes a substrate placement portion 9 on which a substrate W is to be placed, a substrate transfer robot 1 for transferring (placing) the substrate W onto/from the substrate placement portion 9, and a controller 15 for controlling operations of the substrate transfer robot 1 and the substrate placement portion 9. The substrate transfer apparatus 10 may be applied to various types of systems for transferring the substrate W, e.g., an EFEM (Equipment Front End Module), a sorter, and a substrate processing system.

[Structure of Substrate Placement Portion 9]

The substrate placement portion 9 according to the present embodiment is provided with a plurality of (three or more) support columns 92 arranged on the same circumference. On each support column 92, one or a plurality of support portions 91 are formed. The plurality of support columns 92 have the corresponding support portions 91 located on substantially the same plane. The edge of one substrate W is supported by the corresponding plurality of support portions 91. Each support portion 91 is, for example, a groove formed in the support column 92 or a protrusion protruding in the horizontal direction from the support column 92, and thus forms an upward surface for supporting the edge of the substrate W from below.

The substrate placement portion 9 is supported by a turntable 90 and rotates about a rotation axis O. The center of the substrate W placed on the substrate placement portion 9 and the center of the circumference formed by the plurality of support columns 92 (or plurality of support portions 91) are located on an extension line of the rotation axis O. The substrate placement portion 9 is detachably supported on the turntable 90. However, the substrate placement portion 9 and the turntable 90 may be formed integrally. The turntable 90 is provided with a turntable driving device 94 formed from a servomotor or the like, and a rotation position detector 95 for detecting the rotation position of the turntable 90.

[Structure of Substrate Transfer Robot 1]

The substrate transfer robot 1 includes a base stand 11, a robot arm (hereinafter, referred to as "arm 12") supported by the base stand 11, a substrate transfer hand (hereinafter, referred to as "hand 13") connected to a distal end of the arm 12, and an object detection sensor 41 provided to the hand 13.

The arm 12 according to the present embodiment includes a first link 21 extending in the horizontal direction and a second link 22 connected to the first link 21 via a translational joint. A translating device 63 is provided to the first link 21. By operation of the translating device 63, the second link 22 performs translation movement in parallel to the longitudinal direction of the first link 21 relative to the first link 21. The translating device 63 includes a linear motion mechanism (not shown) such as a rail and a slider, a rack and a pinion, a ball screw, or a cylinder, and a servomotor M3 (see FIG. 3) as a driving portion, for example. It is noted that the structure of the translating device 63 is not limited to the above.

A proximal end of the arm 12 is supported by the base stand 11 so as to be able to be lifted/lowered and turned. By operation of a lifting/lowering device 61, a lifting/lowering shaft 23 connected to the proximal end of the arm 12 extends/retracts so that the arm 12 moves to be lifted/lowered relative to the base stand 11. The lifting/lowering device 61 includes a linear motion mechanism (not shown) for extending/retracting the lifting/lowering shaft 23 from/into the base stand 11, and a servomotor M1 (see FIG. 3) as a driving portion, for example.

By operation of the turning device 62, the arm 12 turns about the turning axis relative to the base stand 11. The turning axis of the arm 12 substantially coincides with the axis of the lifting/lowering shaft 23. The turning device 62 includes a gear mechanism (not shown) for rotating the first link 21 about the turning axis, and a servomotor M2 (see FIG. 3) as a driving portion, for example. It is noted that the structures of the lifting/lowering device 61 and the turning device 62 are not limited to the above.

The substrate transfer robot 1 is provided with a "robot reference axis R". The robot reference axis R is a virtual axis extending in parallel to the rotation axis O of the substrate placement portion 9. In the present embodiment, the robot reference axis R is set coaxially with the turning axis of the arm 12, and on the basis of the robot reference axis R, a robot coordinate system to be used for control of the substrate transfer robot 1 is established. The robot reference axis R may be set at any position in the substrate transfer robot 1.

The hand 13 includes a base portion 31 connected to the distal end of the arm 12, and a blade 32 fixed to the base portion 31. The blade 32 is a thin plate member having an end forked so as to form a Y shape (or U shape).

The principal surface of the blade 32 is horizontal, and a plurality of support pads 33 for supporting the substrate W are provided on the upper surface of the blade 32. The plurality of support pads 33 are arranged so as to come into contact with the peripheral portion of the substrate W placed on the blade 32. A pusher 34 is provided on the base end side of the blade 32 on the hand 13. The substrate W placed on the blade 32 is grasped between the pusher 34 and the support pads 33 located at a distal end of the blade 32.

The hand 13 according to the present embodiment transfers the substrate W while holding the substrate W in a horizontal attitude. However, the hand 13 may be capable of holding the substrate W in a vertical attitude. The method for holding the substrate W by the hand 13 according to the present embodiment is an edge holding method. However, instead of the edge holding method, a known method for holding the substrate W, such as a sucking method, a dropping method, or a placement method may be adopted.

At least one object detection sensor 41 is provided on the hand 13. The object detection sensor 41 according to the present embodiment is a transmission-type photo-sensor. However, the object detection sensor 41 is not limited thereto, but may be an object detection sensor of contact type or non-contact type, having a linear-shaped or band-shaped detection area.

Figure 8:
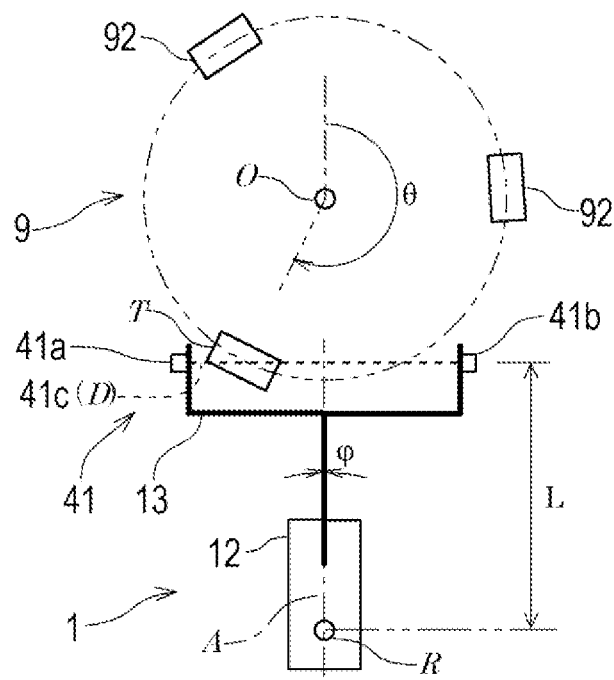
FIG. 8 illustrates a method for calculating the positional relationship between the substrate transfer robot and a substrate placement portion.

The object detection sensor 41 is provided on the back surfaces of the forked ends of the blade 32. With reference to FIG. 8, the object detection sensor 41 is composed of a light projector 41a provided at one of the forked ends of the blade 32, and a light receiver 41b provided at the other one. The light projector 41a and the light receiver 41b are separated from each other in a direction (i.e., horizontal direction) parallel to the principal surface of the blade 32.

The light projector 41a includes a light source for projecting light as a detection medium. The light receiver 41b includes a light receiving element which receives light projected from the light projector 41a and converts the light to an electric signal. The light projector 41a and the light receiver 41b are arranged so as to be opposed to each other, and light emitted from the light projector 41a advances linearly and enters an entrance window of the light receiver 41b. In FIG. 8, an optical axis 41c of light emitted from the light projector 41a is indicated by a dashed line. The object detection sensor 41 is a transmission-type photo-sensor and is capable of detecting an object obstructing the optical axis 41c. When an object passes on the optical axis 41c and the object detection sensor 41 detects that the amount of light entering the light receiver 41b has reduced, the object detection sensor 41 outputs an object detection signal to the controller 15.

[Structure of Controller 15]

Figure 3:
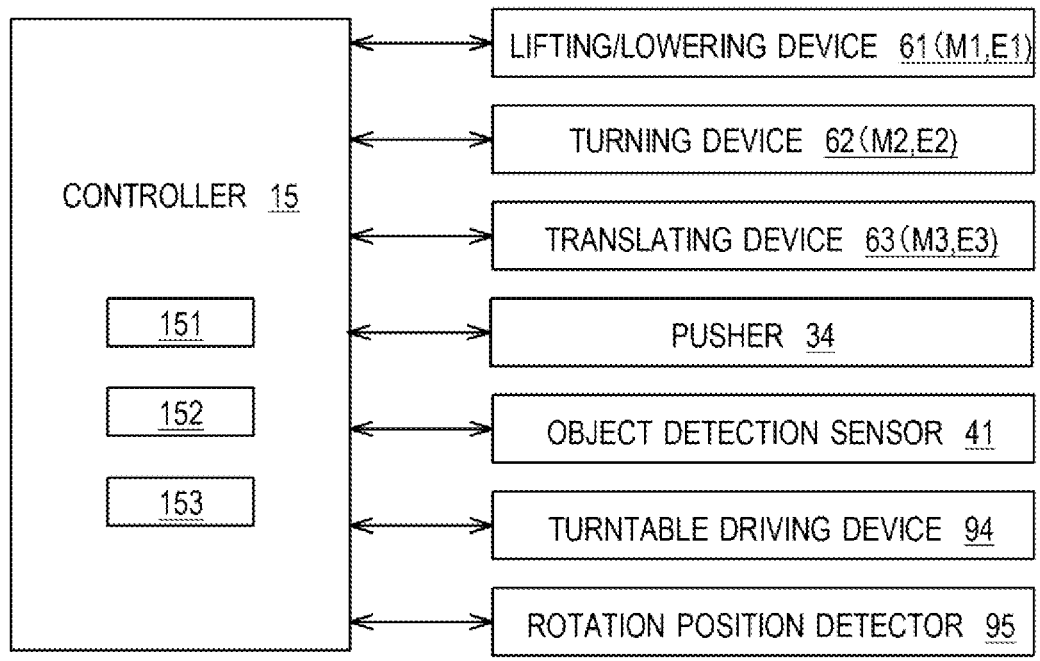
FIG. 3 is a diagram showing the configuration of a control system of the substrate transfer apparatus.

FIG. 3 is a diagram showing the configuration of a control system of the substrate transfer apparatus 10. As shown in FIG. 3, operations of the substrate transfer robot 1 and the substrate placement portion 9 are controlled by the controller 15. However, independent control means may be respectively provided to the substrate transfer robot 1 and the substrate placement portion 9, and these control means may control operation of the substrate transfer apparatus 10 while communicating with each other.

The controller 15 is a so-called computer, and, for example, includes a computing processing device (processor) such as a microcontroller, a CPU, an MPU, a PLC, a DSP, an ASIC, or an FPGA, and volatile and nonvolatile storage devices such as a ROM and a RAM (these are not shown). The storage devices store programs to be executed by the computing processing device, various fixed data, and the like. The programs stored in the storage devices include a rotation axis search program according to the present embodiment. In addition, the storage devices store teaching data for controlling operation of the arm 12, data relevant to the shapes and dimensions of the arm 12 and the hand 13, data relevant to the shape and dimensions of the substrate W held by the hand 13, data for controlling operation of the turntable driving device 94, and the like.

In the controller 15, the computing processing device reads and executes software such as a program stored in the storage device, thereby performing processing for controlling operations of the substrate transfer robot 1 and the substrate placement portion 9. It is noted that the controller 15 may execute each processing through centralized control by a single computer, or may execute each processing through decentralized control by coordination of a plurality of computers.

The servomotor M1 of the lifting/lowering device 61 of the arm 12, the servomotor M2 of the turning device 62, and the servomotor M3 of the translating device 63 are connected to the controller 15. The servomotors M1 to M3 are respectively provided with position detectors E1 to E3 for detecting the rotation angles of the output shafts thereof, and detection signals from the position detectors E1 to E3 are outputted to the controller 15. Further, the pusher 34 of the hand 13 is also connected to the controller 15. On the basis of rotation positions detected by the position detectors E1 to E3, the pose (i.e., position and attitude in space) of the hand 13 corresponding thereto, and teaching data stored in a storage unit, the controller 15 calculates a desired pose to be made after elapse of a predetermined control time. The controller 15 operates the servomotors M1 to M3 so that the hand 13 has a desired pose after elapse of the predetermined control time.

Further, the turntable driving device 94 and the rotation position detector 95 of the turntable 90 are connected to the controller 15. The controller 15 operates the turntable driving device 94 on the basis of a program stored in advance and a rotation position detected by the rotation position detector 95. Thus, the substrate placement portion 9 can be rotated to a desired rotation position.

[Searching Method for Target T]

Figure 4:
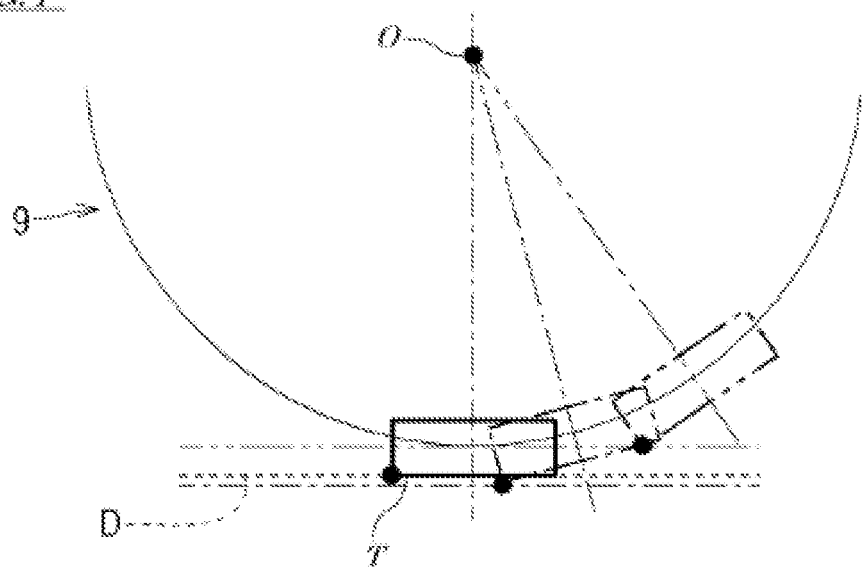
FIG. 4 illustrates detection of an outer peripheral surface of a rotating target by an object detection sensor.
Figure 5:
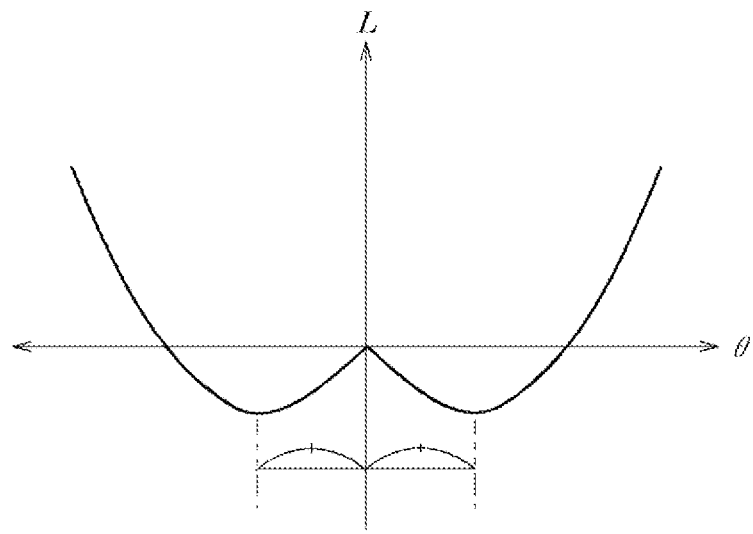
FIG. 5 shows the relationship between an index length and a rotation position of the target in FIG. 4.
Figure 6:
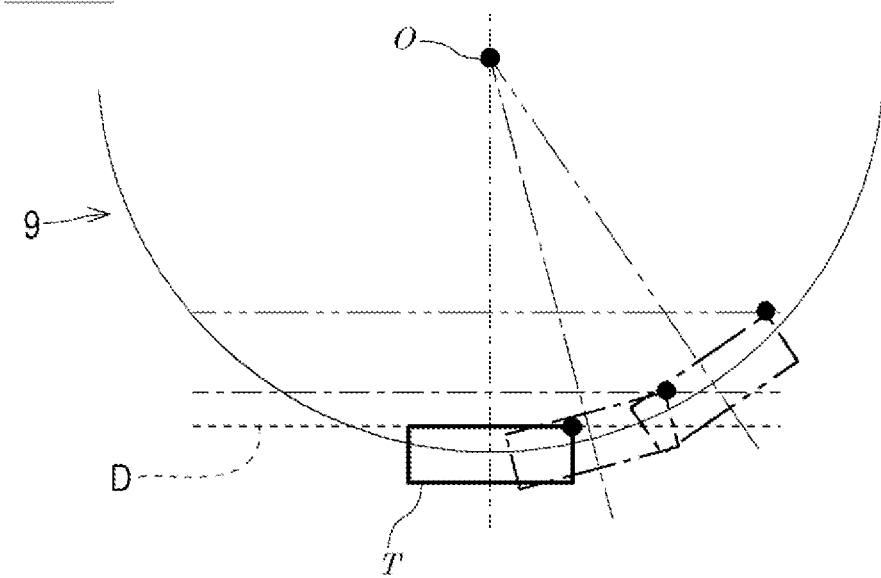
FIG. 6 illustrates detection of an inner peripheral surface of the rotating target by the object detection sensor.
Figure 7:
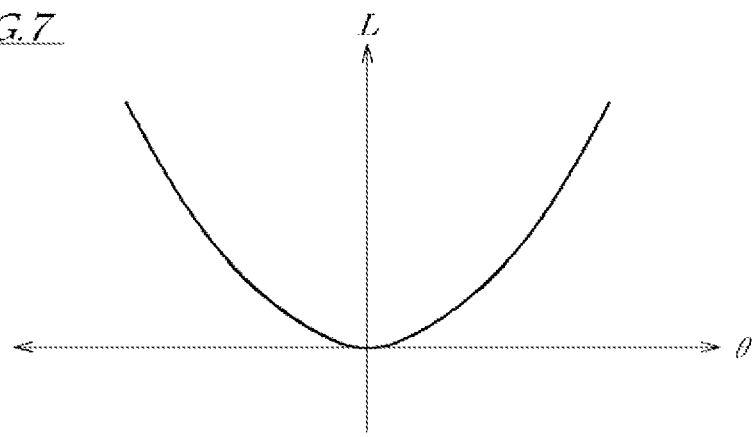
FIG. 7 shows the relationship between the index length and the rotation position of the target in FIG. 6.

Here, a method for the substrate transfer robot 1 to search for a target T will be described. FIG. 4 illustrates detection of an outer peripheral surface of the rotating target T by the object detection sensor 41, and FIG. 5 shows the relationship between an index length L and a rotation position θ of the target T in FIG. 4. FIG. 6 illustrates detection of an inner peripheral surface of the rotating target T by the object detection sensor 41, and FIG. 7 shows the relationship between the index length L and the rotation position θ of the target T in FIG. 6. In FIGS. 5 and 7, the rotation position θ of the target T is represented using, as a reference, the position of the target T indicated by solid lines in FIGS. 4 and 6.

Here, the "index length L" is defined as the distance from the robot reference axis R to the target T in a direction perpendicular to the axial direction of the robot reference axis R when the target T is detected by the object detection sensor 41. In addition, the "rotation position θ of the target T" is defined as the rotation position of the target T about the rotation axis O. The rotation position θ of the target T is correlated with the rotation position of the substrate placement portion 9, and changes as the substrate placement portion 9 is rotated about the rotation axis O, and the rotation position θ of the target T can be calculated from the detection value of the rotation position detector 95 provided to the substrate placement portion 9. In addition, a "rotation position φ of a detection area D" is defined as the rotation position of a detection area D (corresponding to the optical axis 41c in the present embodiment) of the object detection sensor 41 about the robot reference axis R. The rotation position φ of the detection area D is correlated with the rotation position of the arm 12, and can be calculated from the detection value of a position detector E2 of the servomotor M2 for turning. The rotation position θ and the rotation position φ each represent a rotation angle from a given rotation reference position.

For example, as shown in FIG. 4, the target T is located between the rotation axis O and the robot reference axis R, and if the detection area D of the object detection sensor 41 is moved from the robot reference axis R side toward the rotation axis O side to detect the target T, the outer peripheral surface of the target T is detected first. Here, the "outer peripheral surface of the target T" is a part, of the surface of the target T, that is located on the outer circumferential side of a predetermined circle centered on the rotation axis O and passing the target T as seen in a direction parallel to the axial direction of the robot reference axis R.

Ideally, the target T is a column having an extremely small sectional area. However, the actual target T does not have such an ideal shape, but has a certain sectional area and is not limited to a columnar shape.

For example, in the case where the target T has a prism shape with a rectangular cross section, while the rotation position φ of the detection area D is kept and the rotation position θ of the target T is changed, the outer peripheral surface of the target T is detected by the object detection sensor 41 at a plurality of rotation positions θ of the target T and the index length L is calculated, whereby the relationship between the rotation position θ of the target T and the index length L is obtained as shown by the graph in FIG. 5.

In the relationship between the rotation position θ of the target T and the index length L shown in FIG. 5, the rotation position θ of the target T and the index length L are not in proportion to each other, and the line representing the index length L with respect to the rotation position θ of the target T forms a parabola with two peaks. The reason is as follows. When the target T rotates about the rotation axis O, the positive/negative sign of the amount of movement due to revolution of the target T, in the direction parallel to a line (hereinafter, referred to as "arm reference line A") connecting the robot reference axis R and the detection area D, and the positive/negative sign of the amount of movement due to turning of the target T, in the direction parallel to the arm reference line A, are reversed in some regions. Such an event occurs in the case where the target T has a plurality of farthest points from the rotation axis O.

As described above, in the case of detecting the outer peripheral surface of the target T by the object detection sensor 41, depending on the shape of the target T, the line connecting the target T and the rotation axis O, and the arm reference line A, may not be parallel to each other at the rotation position θ of the target T at which the index length L is minimized.

On the other hand, as shown in FIG. 6, for example, in the case where the target T has a prism shape with a rectangular cross section, while the rotation position φ of the detection area D is kept constant and the rotation position θ of the target T is changed, the inner peripheral surface of the target T is detected by the object detection sensor 41 at a plurality of rotation positions θ of the target T to calculate the index length L, whereby the relationship between the rotation position θ of the substrate placement portion 9 and the index length L is obtained as shown by the graph in FIG. 7. Here, the "inner peripheral surface of the target T" is a part, of the surface of the target T, that is located on the inner circumferential side of a predetermined circle centered on the rotation axis O and passing the target T as seen in a direction parallel to the axial direction of the robot reference axis R.

In the relationship between the rotation position θ of the target T and the index length L shown in FIG. 7, the rotation position θ of the target T and the index length L are proportional to each other, and the line representing the index length L with respect to the rotation position θ of the target T forms a parabola. The reason is as follows. When the target T rotates about the rotation axis O, the positive/ negative sign of the amount of movement due to revolution of the target T, in the direction parallel to the arm reference line A, and the positive/negative sign of the amount of movement due to turning of the target T, in the direction parallel to the arm reference line A, are constantly the same.

In the relationship between the rotation position θ of the target T and the index length L when the inner peripheral surface of the target T is detected by the object detection sensor 41 as described above, the line connecting the target T and the rotation axis O, and the arm reference line A, are parallel to each other at the rotation position θ of the target T at which the index length L is minimized.

On the basis of the above premise, in the method for calculating the positional relationship between the substrate transfer robot 1 and the substrate placement portion 9 described below, the inner peripheral surface of the target T is to be detected by the object detection sensor 41 during searching for the target T by the substrate transfer robot 1.

That is, in detecting the target T by the object detection sensor 41, the controller 15 operates the substrate transfer robot 1 and/or the substrate placement portion 9 such that, as seen in the direction parallel to the axial direction of the robot reference axis R, the detection area D of the object detection sensor 41 is once moved to a region between the rotation axis O and the target T, and then the detection area D is moved toward the target T, to detect the target T.

In particular, as shown in FIG. 6, in the case where the target T is located between the rotation axis O and the robot reference axis R as seen in the direction parallel to the axial direction of the robot reference axis R, first, the detection area D of the object detection sensor 41 which is located on the robot reference axis R side with respect to the target T is moved from the robot reference axis R side toward the rotation axis O side, to perform preliminary detection for the target T. Next, the detection area D is further moved toward the rotation axis O until the target T is no longer detected. Subsequently, the detection area D is moved from the rotation axis O side toward the robot reference axis R side to detect the target T, and the index length L is calculated for this secondarily detected target T.

[Method for Calculating Positional Relationship Between Substrate Transfer Robot 1 and Substrate Placement Portion 9]

Next, the method for calculating the positional relationship between the substrate transfer robot 1 and the substrate placement portion 9 by using the searching method for the target T as described above will be described with reference to FIG. 8.

Processing for calculating the positional relationship between the substrate transfer robot 1 and the substrate placement portion 9 is performed by the controller 15. The controller 15 reads and executes a predetermined program stored in a storage device in advance, to function as a target searching unit 151, an index calculation unit 152, and a positional relationship calculation unit 153.

First, the target searching unit 151 operates the substrate transfer robot 1 and the substrate placement portion 9 so as to detect the target T by the object detection sensor 41 at a plurality of rotation positions when the rotation position θ of the target T about the rotation axis O is changed in a state in which the rotation position φ of the detection area D about the robot reference axis R is kept constant. Alternatively, the target searching unit 151 may operate the substrate transfer robot 1 and the substrate placement portion 9 so as to detect the target T by the object detection sensor 41 at a plurality of rotation positions when the rotation position φ of the detection area D is changed in a state in which the rotation position θ of the target T is kept constant. Still alternatively, the target searching unit 151 may operate the substrate transfer robot 1 and the substrate placement portion 9 so as to detect the target T by the object detection sensor 41 at a plurality of rotation positions when the rotation position θ of the target T and the rotation position φ of the detection area D are both changed. Here, the object detection sensor 41 detects a part, of the surface of the target T, that is located on the inner circumferential side of a predetermined circle centered on the rotation axis O and passing the target T.

Next, for each of the plurality of rotation positions at which the target T is detected by the object detection sensor 41, the index calculation unit 152 calculates a quantity correlated with the index length L representing the distance from the robot reference axis R to the target T when the target T is detected by the object detection sensor 41. The quantity correlated with the index length L may be at least one of the index length L itself, the amount of movement of the hand 13, the detection values of the position detectors E1 to M3 of the motors M1 to M3 for operating the arm 12, and the like.

Subsequently, the positional relationship calculation unit 153 calculates the positional relationship between the robot reference axis R and the rotation axis O on the basis of the maximum or minimum one of the quantities correlated with the index length L. The positional relationship between the robot reference axis R and the rotation axis O may be, for example, the distance from the robot reference axis R to the rotation axis O of the substrate placement portion 9 (Example 1), the rotation position θs of the target T located on the line connecting the robot reference axis R and the rotation axis O (Example 2), the rotation position φs of the detection area D when the line connecting the robot reference axis R and the detection area D is directed toward the rotation axis O (Example 3), or the direction in which the rotation axis O of the substrate placement portion 9 is present as seen from the robot reference axis R (Example 4). Examples 1 to 4 will be described later. The positional relationship calculation unit 153 may store (teach) the calculated positional relationship between the robot reference axis R and the rotation axis O into the storage device. It is noted that, also in the case of calculating the directional relationship between the robot reference axis R and the rotation axis O as in Example 2 and Example 3, the distance between the robot reference axis R and the rotation axis O may be calculated together, using a known distance from the rotation axis O to the target T, and the distance from the robot reference axis R to the detection area D, which is calculated from the detection values of the position detectors E1 to E3, the design values of the substrate transfer robot 1, and the like.

Example 1

In Example 1, the distance from the robot reference axis R to the rotation axis O of the substrate placement portion 9 is calculated. Here, as shown in FIG. 8, the cross section of the target T along the direction parallel to the axial direction of the robot reference axis R has a rectangular shape, and the distance from the inner peripheral surface of the target T to the rotation axis O is known. The rotation position φ of the detection area D is a rotation position when the arm reference line A is directed toward the rotation axis O.

Figure 9:
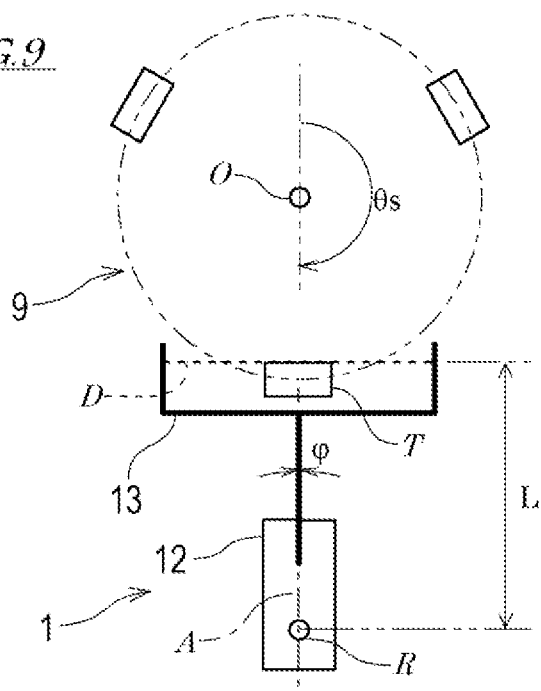
FIG. 9 illustrates the method for calculating the positional relationship between the substrate transfer robot and the substrate placement portion, and shows a state in which the target is located on a line connecting a robot reference axis and a rotation axis.

First, the controller 15 searches for the target T by the substrate transfer robot 1 at a plurality of rotation positions θ of the target T, to calculate the minimum value of the index length L as shown in FIG. 9.

Next, the controller 15 adds the known distance from the inner peripheral surface of the target T to the rotation axis O, to the calculated minimum value of the index length L, to calculate the distance from the robot reference axis R to the rotation axis O. Further, the controller 15 stores (teaches) the calculated distance from the robot reference axis R to the rotation axis O into the storage device.

Example 2

In Example 2, the rotation position θs of the target T located on the line connecting the robot reference axis R and the rotation axis O is calculated, and the reference rotation position of the substrate placement portion 9 is calibrated using the calculated rotation position θs. Here, as shown in FIG. 8, the cross section of the target T along the direction parallel to the axial direction of the robot reference axis R has a rectangular shape. In addition, the rotation position φ of the detection area D is a rotation position when the arm reference line A is directed toward the rotation axis O.

First, the controller 15 searches for the target T by the substrate transfer robot 1 at a plurality of rotation positions θ of the target T, to find out the rotation position θs of the target T at which the index length L is minimized as shown in FIG. 9. When the index length L is minimized, the target T is located on the line connecting the robot reference axis R and the rotation axis O.

Next, the controller 15 stores (teaches) the rotation position θs of the target T when the target T is located on the line connecting the robot reference axis R and the rotation axis O, as the calibrated reference rotation position of the substrate placement portion 9 (i.e., rotation position of 0°), into the storage device.

Example 3

In Example 3, the rotation position φs of the detection area D at which the line connecting the robot reference axis R and the detection area D is directed toward the rotation axis O, i.e., the rotation axis O crosses the line connecting the robot reference axis R and the detection area D, is calculated. Here, as shown in FIG. 9, the rotation position θs of the target T located on the line connecting the robot reference axis R and the rotation axis O is known. In addition, the cross section of the target T along the direction parallel to the axial direction of the robot reference axis R has a rectangular shape.

Figure 10:
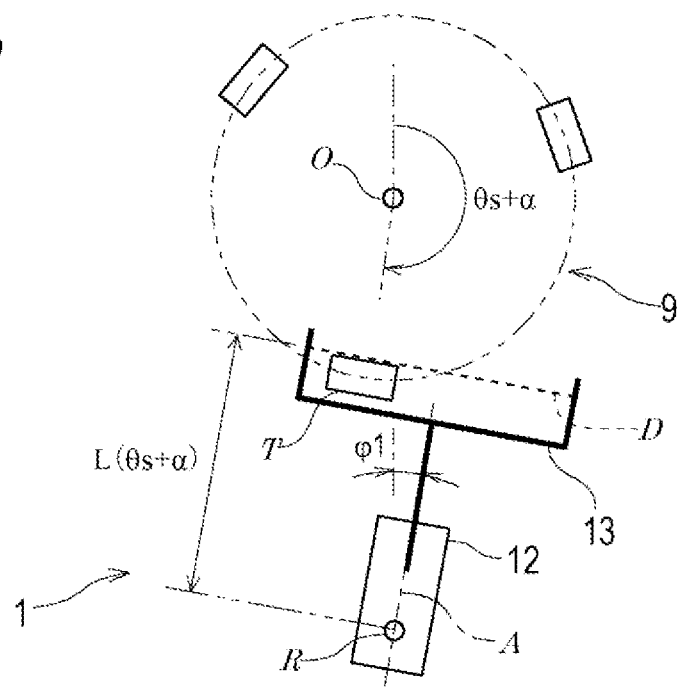
FIG. 10 illustrates the method for calculating the positional relationship between the substrate transfer robot and the substrate placement portion, and shows a state in which the target is located at a rotation position ($\theta s+\alpha$).

First, as shown in FIG. 10, the controller 15 operates the substrate placement portion 9 so as to move the target T located on the line connecting the robot reference axis R and the rotation axis O from the rotation position θs to a rotation position (θs+α). Then, the controller 15 finds out a rotation position φ1 of the detection area D at which the index length L(θs+α) is minimized.

Figure 11:
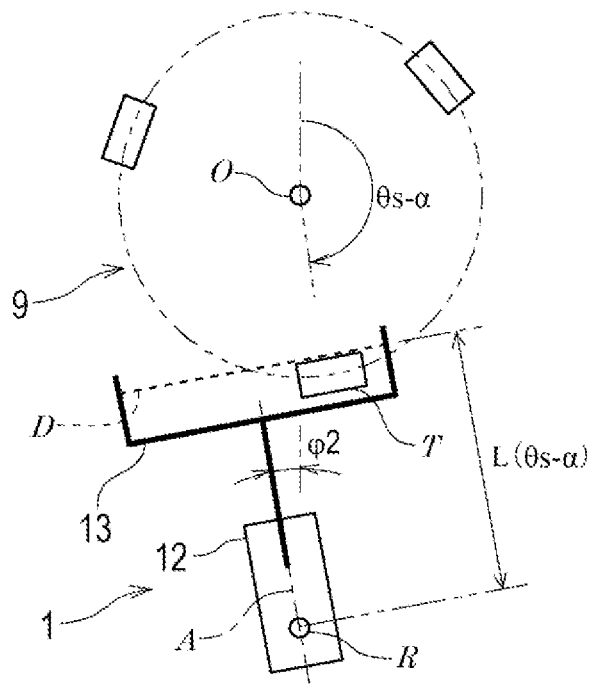
FIG. 11 illustrates the method for calculating the positional relationship between the substrate transfer robot and the substrate placement portion, and shows a state in which the target is located at a rotation position ($\theta s-\alpha$).

Next, as shown in FIG. 11, the controller 15 operates the substrate placement portion 9 so as to move the rotation position of the target T to a rotation position (θs−α). Then, the controller 15 finds out a rotation position φ2 of the detection area D at which the index length L(θs−α) is minimized.

Further, the controller 15 calculates the middle rotation position (φs=(φ1+φ2)/2) between the rotation position φ1 and the rotation position φ2, as the rotation position φs of the detection area D at which the line connecting the robot reference axis R and the detection area D is directed toward the rotation axis O, i.e., the rotation axis O crosses the line connecting the robot reference axis R and the detection area D, and stores (teaches) the rotation position φs into the storage device.

Example 4

In Example 4, the reference rotation position of the substrate placement portion 9 relative to the substrate transfer robot 1 is calculated. In transferring the substrate W onto/from the substrate placement portion 9 by the substrate transfer robot 1, if the reference rotation position of the substrate placement portion 9 relative to the substrate transfer robot 1 has been set in advance, the controller 15 can estimate the present position of the support column 92 through calculation, thereby preventing interference between the substrate transfer robot 1 and the support column 92.

Figure 12:
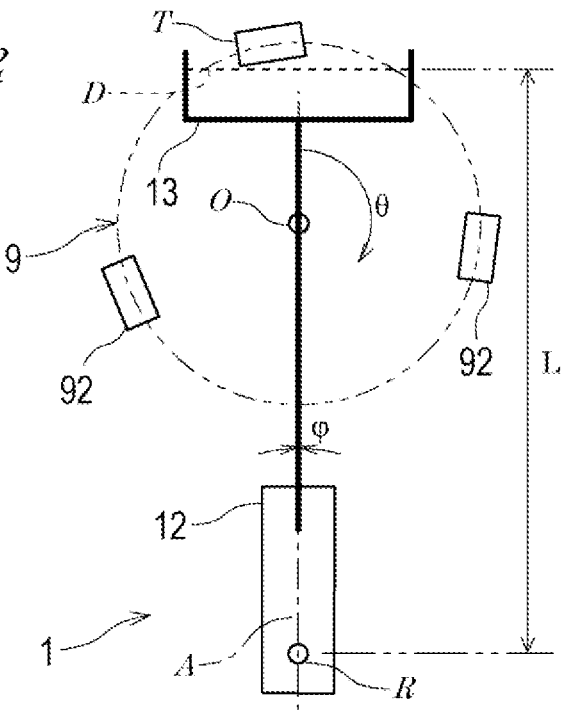
FIG. 12 illustrates the method for calculating the positional relationship between the substrate transfer robot and the substrate placement portion, and shows a state in which a detection area moves in parallel to the line connecting the robot reference axis and the rotation axis.

Here, as shown in FIG. 12, the direction in which the rotation axis O is present as seen from the robot reference axis R is known, and the rotation position φ of the detection area D at which the direction of movement of the detection area D due to extension/retraction of the arm 12 is parallel to the line connecting the robot reference axis R and the rotation axis O, is known. The detection area D moves in parallel to the line connecting the robot reference axis R and the rotation axis O. The cross section of the target T along the direction parallel to the axial direction of the robot reference axis R has a rectangular shape, and the target T is located far from the robot reference axis R beyond the rotation axis O.

First, with the rotation position φ of the detection area D fixed, the controller 15 searches for the target T by the substrate transfer robot 1 while changing the rotation position θ of the target T, and as shown in FIG. 13, finds the rotation position θl of the target T at which the index length L is maximized. When the target T is located at the rotation position θl, the robot reference axis R, the rotation axis O, and the target T are arranged in this order on one straight line.

Next, the controller 15 stores (teaches) the rotation position of the substrate placement portion 9 when the target T is located at the rotation position θl, as the reference rotation position of the substrate placement portion 9 relative to the substrate transfer robot 1, into the storage device.

As described above, the substrate transfer apparatus 10 according to the present embodiment includes: the substrate transfer robot 1 provided with the robot reference axis R and having the object detection sensor 41 for detecting an object obstructing the detection area D and the arm 12 for moving the object detection sensor 41 in a plane perpendicular to the axial direction of the robot reference axis; the substrate placement portion 9 having the target T to be detected by the object detection sensor 41, the substrate placement portion 9 being configured to rotate about the rotation axis O extending in parallel to the axial direction of the robot reference axis R; and the controller 15 configured to control operations of the substrate transfer robot 1 and the substrate placement portion 9. The controller 15 includes: a target searching unit 151 configured to operate the substrate transfer robot 1 and the substrate placement portion 9 so as to detect a part, of the surface of the target T, that is located on the inner circumferential side of a predetermined circle centered on the rotation axis O and passing the target T, by the object detection sensor 41, at a plurality of rotation positions when at least one of the rotation position θ of the target T about the rotation axis O and the rotation position φ of the detection area D about the robot reference axis R is changed; an index calculation unit 152 configured to calculate a quantity correlated with the index length L representing the distance from the robot reference axis R to the target T when the target T is detected by the object detection sensor 41, for each of the plurality of rotation positions; and a positional relationship calculation unit 153 configured to calculate the positional relationship between the robot reference axis R and the rotation axis O on the basis of the maximum or minimum one of the quantities correlated with the index length L.

The method for calculating the positional relationship between the substrate transfer robot 1 and the substrate placement portion 9 according to the present embodiment includes the steps of: detecting a part, of the surface of the target T, that is located on the inner circumferential side of a predetermined circle centered on the rotation axis O and passing the target T, by the object detection sensor 41, at a plurality of rotation positions when at least one of the rotation position θ of the target T about the rotation axis O and the rotation position φ of the detection area D about the robot reference axis R is changed; calculating a quantity correlated with the index length L representing the distance from the robot reference axis R to the target T when the target T is detected by the object detection sensor 41, for each of the plurality of rotation positions; and calculating the positional relationship between the robot reference axis R and the rotation axis O on the basis of the maximum or minimum one of the quantities correlated with the index length L.

According to the substrate transfer apparatus 10 and the method for calculating the positional relationship between the substrate transfer robot 1 and the substrate placement portion 9 described above, the positive/negative sign of the amount of movement due to revolution of the target T, in the direction parallel to the arm reference line A, and the positive/negative sign of the amount of movement due to turning of the target T, in the direction parallel to the arm reference line A, are the same, irrespective of the shape of the target T. Thus, it becomes possible to use factors that are the minimum value and the maximum value of the index length L, for specifying the rotation position θ of the target T, irrespective of the shape of the target T.

Since the positional relationship between the robot reference axis R and the rotation axis O of the substrate placement portion 9 can be searched for by the substrate transfer robot 1 as described above, it becomes possible to automatically teach the substrate transfer robot 1 the position of the substrate placement portion 9.

In the substrate transfer apparatus 10 according to the above embodiment, the controller 15 operates the substrate transfer robot 1 so as to: first, move the detection area D of the object detection sensor 41 toward the rotation axis O side from the robot reference axis R side with respect to the target T, to perform preliminary detection for the target T; next, further move the detection area D of the object detection sensor 41 toward the rotation axis O side until the target T is no longer detected; and subsequently, move the detection area D of the object detection sensor 41 toward the robot reference axis R side from the rotation axis O side with respect to the target T, to detect the target T.

Similarly, in the method for calculating the positional relationship between the substrate transfer robot 1 and the substrate placement portion 9 according to the present embodiment, the step of detecting the target T by the object detection sensor 41 includes: first, moving the detection area D of the object detection sensor 41 toward the rotation axis O side from the robot reference axis R side with respect to the target T, to perform preliminary detection for the target T; next, further moving the detection area D of the object detection sensor 41 toward the rotation axis O side until the target T is no longer detected; and subsequently, moving the detection area D of the object detection sensor 41 toward the robot reference axis R side from the rotation axis O side with respect to the target T, to detect the target T.

The substrate transfer apparatus 10 and the method for calculating the positional relationship between the substrate transfer robot 1 and the substrate placement portion 9 as described above enable the substrate transfer robot 1 to automatically operate to detect the inner peripheral surface of the target T.

While the preferred embodiment of the present invention has been described above, the details of specific structures and/or functions of the above embodiment may be modified without deviating from the scope of the present invention, and such modifications can be included in the present invention.

REFERENCE SIGNS LIST 1 substrate transfer robot
9 substrate placement portion
10 substrate transfer apparatus
11 base stand
12 arm
13 hand
15 controller
151 target searching unit
152 index calculation unit
153 positional relationship calculation unit
21, 22 link
23 lifting/lowering shaft
31 base portion
32 blade
33 support pad
34 pusher
41 object detection sensor
41a light projector
41b light receiver
41c optical axis
61 lifting/lowering device
62 turning device
63 translating device
90 turntable
91 support portion
92 support column
94 turntable driving device
95 rotation position detector
A arm reference line
D detection area
E1 to E3 position detector
L index length
M1 to M3 servomotor
O rotation axis
R robot reference axis
T target
W substrate

The invention claimed is:

1. A method for calculating a positional relationship between a substrate transfer robot and a substrate placement portion, the substrate transfer robot being provided with a robot reference axis and having an object detection sensor for detecting an object obstructing a detection area, and a robot arm for moving the detection area in a plane perpendicular to an axial direction of the robot reference axis, the substrate placement portion having a plurality of targets and being configured to rotate about a rotation axis extending in parallel to the axial direction, for each of the plurality of targets, the method comprising the steps of:

detecting a part of a surface of the target that is located on an inner circumferential side of a predetermined circle using the object detection sensor at a plurality of rotation positions,
        wherein the circle is centered on the rotation axis and passes through the plurality of targets, and
        wherein at least one of a rotation position of the target about the rotation axis and a rotation position of the detection area about the robot reference axis is changed for each of the plurality of rotation positions;
    calculating a quantity correlated with an index length representing a distance from the robot reference axis to the target, wherein the target is detected by the object detection sensor, for each of the plurality of rotation positions; and
    calculating the positional relationship between the robot reference axis and the rotation axis on the basis of, among the plurality of rotation positions, the one at which the quantity correlated with the index length is maximized or minimized.

2. The method for calculating the positional relationship between the substrate transfer robot and the substrate placement portion according to claim 1, wherein
    the step of detecting the target by the object detection sensor includes
        moving the detection area toward a rotation axis side from a robot reference axis side with respect to the target, to perform preliminary detection for the target, and
        further moving the detection area toward the rotation axis side until the target is no longer detected, and moving the detection area toward the robot reference axis side from the rotation axis side with respect to the target, to detect the target.

3. A substrate transfer apparatus comprising:
    a substrate transfer robot provided with a robot reference axis and having an object detection sensor for detecting an object obstructing a detection area, and a robot arm for moving the object detection sensor in a plane perpendicular to an axial direction of the robot reference axis;
    a substrate placement portion having a target to be detected by the object detection sensor, the substrate placement portion being configured to rotate about a rotation axis extending in parallel to the axial direction; and
    a controller configured to control operations of the substrate transfer robot and the substrate placement portion, wherein
    the controller is programmed to perform the following:
        operate the substrate transfer robot and the substrate placement portion so as to detect a part of a surface of the target that is located on an inner circumferential side of a predetermined circle using the object detection sensor at a plurality of rotation positions,
            wherein the predetermined circle is centered on the rotation axis and passes through the target, and
            wherein at least one of a rotation position of the target about the rotation axis and a rotation position of the detection area about the robot reference axis is changed;
        operate the substrate transfer robot so as to:
            (i) move the detection area toward a rotation axis side from a robot reference axis side with respect to the target, to perform preliminary detection for the target,
            (ii) further move the detection area toward the rotation axis side until the target is no longer detected, and
            (iii) move the detection area toward the robot reference axis side from the rotation axis side with respect to the target, to detect the target,
        calculate a quantity correlated with an index length representing a distance from the robot reference axis to the target when the target is detected by the object detection sensor, for each of the plurality of rotation positions; and
        calculate a positional relationship between the robot reference axis and the rotation axis on the basis of, among the plurality of rotation positions, the one at which the quantity correlated with the index length is maximized or minimized.

\* \* \* \* \*